US009325307B2

(12) United States Patent
Odagiri

(10) Patent No.: US 9,325,307 B2
(45) Date of Patent: Apr. 26, 2016

(54) SEMICONDUCTOR DEVICE

(71) Applicant: RENESAS ELECTRONICS CORPORATION, Kawasaki-shi, Kanagawa (JP)

(72) Inventor: Naoya Odagiri, Itami (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 47 days.

(21) Appl. No.: 14/012,257

(22) Filed: Aug. 28, 2013

(65) Prior Publication Data

US 2014/0062576 A1    Mar. 6, 2014

(30) Foreign Application Priority Data

Aug. 31, 2012    (JP) .................................. 2012-191082

(51) Int. Cl.
*H03K 17/16*    (2006.01)
*H03K 17/64*    (2006.01)

(52) U.S. Cl.
CPC .............. *H03K 17/161* (2013.01); *H03K 17/64* (2013.01)

(58) Field of Classification Search
USPC ....................................................... 327/382
See application file for complete search history.

(56) References Cited

U.S. PATENT DOCUMENTS

| 8,115,563 | B2 | 2/2012 | Odagiri | |
| 2004/0217782 | A1* | 11/2004 | Brown | 327/108 |
| 2011/0182446 | A1* | 7/2011 | Shajaan et al. | 381/150 |
| 2012/0112775 | A1* | 5/2012 | Domes | 324/686 |

FOREIGN PATENT DOCUMENTS

| JP | 4-150794 A | 5/1992 |
| JP | 2006-020405 A | 1/2006 |
| JP | 2011-004328 A | 1/2011 |

OTHER PUBLICATIONS

Notification of Reasons for Refusal Japanese Patent Application No. 2012-191082 dated Jan. 12, 2016 with English translation.

* cited by examiner

*Primary Examiner* — Lincoln Donovan
*Assistant Examiner* — Patrick Chen
(74) *Attorney, Agent, or Firm* — McDermott Will & Emery LLP

(57) ABSTRACT

The semiconductor device includes first and second output terminals each coupled to one end side and another end side of an inductive or capacitive load, a first MOS transistor coupled between a first voltage and the first output terminal, a second MOS transistor coupled between a second voltage and the first output terminal, a third MOS transistor coupled between the first voltage and the second output terminal, a fourth MOS transistor coupled between the second voltage and the second output terminal, and a drive circuit driving the first to fourth MOS transistors for controlling the inductive or capacitive load, and further includes first and second bypass transistors for bypassing a forward current of a parasitic diode of a PN-junction formed in the MOS transistor in the dead-off period.

5 Claims, 12 Drawing Sheets

SEMICONDUCTOR DEVICE

CROSS-REFERENCE TO RELATED APPLICATION

The disclosure of Japanese Patent Application No. 2012-191082 filed on Aug. 31, 2012 including the specification, drawings and abstract is incorporated herein by reference in its entirety.

BACKGROUND

The present invention relates to a semiconductor device, and to a semiconductor device that is driven by being coupled to an inductive or capacitive load.

Recently, as to a semiconductor device, higher performance or higher functionality is required and, at the same time, cost reduction and shortening of a development period are required. It is indispensable to provide a plurality of functions over an identical semiconductor chip, but, in order to provide circuits having different functions and characteristics, various problems have to be solved.

For example, in this respect, in Japanese Patent Laid-Open No. 04-150794, there is disclosed a system realizing a bridge-type drive circuit using PWM driving having low power consumption and low noise, in the case of making an integrated circuit into one chip.

SUMMARY

In addition, when a plurality of circuits having different functions and characteristics is provided, it is also necessary to prevent interference between each of circuits. In particular, in a circuit that drives an inductive load or a capacitive load that is a factor for generating the interference, this point is important.

The present invention has been made in view of the above circumstances and provides a semiconductor device capable of suppressing the interference, in a semiconductor device that drives an inductive load or a capacitive load.

The other problems and the new feature of the present invention will become clear from the description of the present specification and the accompanying drawings.

According to an embodiment, a semiconductor device includes first and second output terminals each coupled to one end side and another end side of an inductive or capacitive load, a first MOS transistor coupled between a first voltage and the first output terminal, a second MOS transistor coupled between a second voltage and the first output terminal, a third MOS transistor coupled between the first voltage and the second output terminal, a fourth MOS transistor coupled between the second voltage and the second output terminal, and a drive circuit driving the first to fourth MOS transistors for controlling the inductive or capacitive load, and the drive circuit drives the first to fourth MOS transistors while providing a dead-off period so that the first and second MOS transistors or the third and fourth MOS transistors are not conductive each other, and the device further includes first and second bypass transistors which are each provided corresponding to the first and second output terminals and which are for bypassing a forward current of a parasitic diode of a PN-junction formed in the MOS transistor in the dead-off period.

According to an embodiment, it is possible to suppress interference in a semiconductor device that drives an inductive load or a capacitive load.

DETAILED DESCRIPTION

Figure 1:
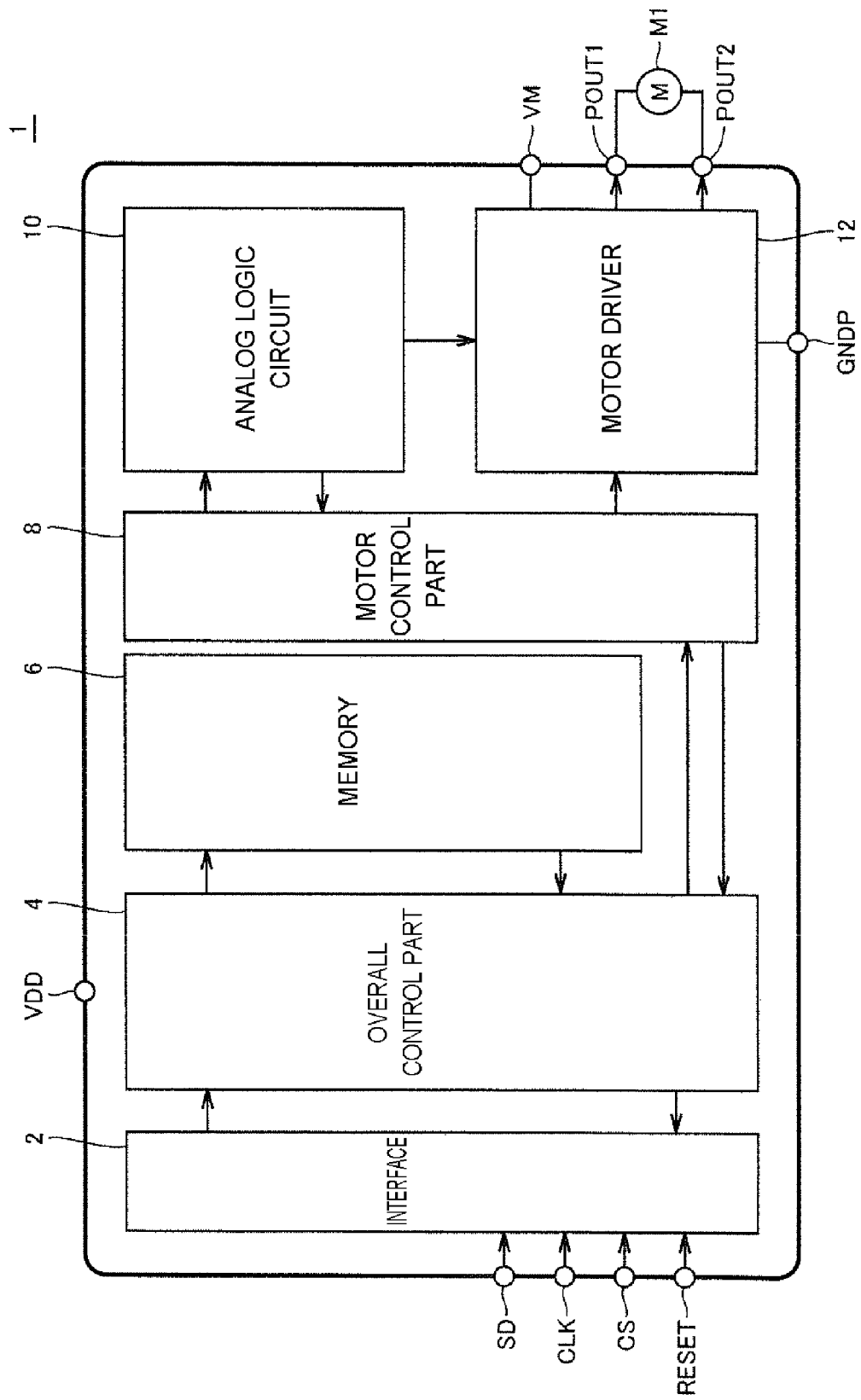
FIG. 1 is a schematic configuration diagram of a motor control unit 1 made into one chip according to an embodiment.

The embodiments are explained in detail with reference to the drawings. Meanwhile, in the drawings, the same symbol is attached to the same or corresponding part and the repeated explanation thereof is omitted.

FIG. 1 is a schematic configuration diagram of a motor control unit 1 made into one chip according to an embodiment.

With reference to FIG. 1, the motor control unit 1 is coupled to a motor M1 for output terminals POUT1 and POUT2, and controls the motor M1.

As examples of the terminals provided on the periphery of the motor control unit 1, there are provided, respectively, a serial data (SD) input terminal for serially encoding and inputting a control instruction for controlling the motor driver 12, a CLK terminal to which a clock for defining an operation is inputted, a CS terminal to which a chip select signal is inputted, a RESET terminal to which a reset signal is inputted, a VDD terminal coupled to a power supply voltage VDD supplied to each part, a VM terminal coupled to a power supply voltage VM for motor drive supplied to each part, the POUT1 terminal and the POUT2 terminal externally coupled to the motor M1, and a GNDP terminal coupled to the ground voltage GND supplied to each part. Control instructions include the setting of normal rotation or reverse rotation of the rotation direction, the setting of an OFF mode, the setting of a drive system and the like of the motor M1 to be driven.

The motor control unit 1 includes an interface 2, an overall control part (MCU) 4, a memory 6, a motor control part 8, an analog logic circuit 10 and the motor driver 12. The interface 2 receives the input of signals from the SD terminal, the CLK terminal, the CS terminal and the RESET terminal. In addition, the overall control part 4 receives an input of signal from the outside via the interface 2 and controls the whole of the chip. In the memory 6, various programs, data or the like are stored, and the overall control part 4 loads the various programs, data or the like, and executes a prescribed function. In the present example, the motor control part 8 instructs first and second sub-drive parts to be described included in the analog logic circuit 10 to thereby control the motor driver 12. Furthermore, the motor control part 8 also outputs a signal that activates the motor driver 12.

The analog logic circuit 10 is provided with a circuit required to have analog characteristics and performs giving/receiving of data to/from the motor control part 8.

The motor driver 12 drives the motor M1 coupled to the output terminals POUT1 and POUT2 in accordance with the instruction from the motor control part 8.

Here, as a comparative example, the configuration of a general motor driver will be explained.

Figure 2:
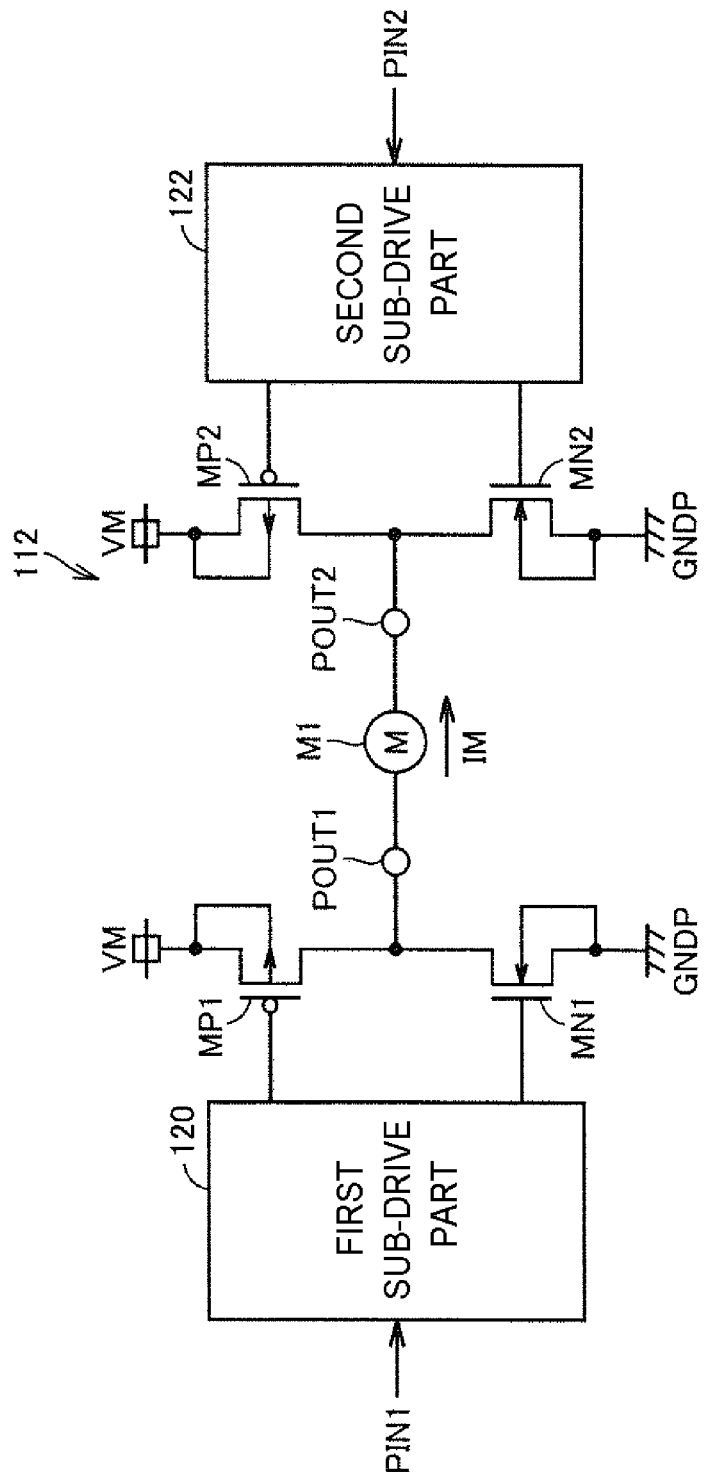
FIG. 2 is a diagram explaining the configuration of a general motor driver 112.

FIG. 2 is a diagram explaining the configuration of a general motor driver 112.

With reference to FIG. 2, the motor driver 112 includes a P-channel MOS transistor MP1 (hereinafter, also simply referred to as a transistor MP1) coupled between the power supply voltage VM and the output terminal POUT1, an N-channel MOS transistor MN1 (hereinafter, also simply referred to as a transistor MN1) coupled between the output terminal POUT1 and the ground voltage GNDP, a P-channel MOS transistor MP2 (hereinafter, also simply referred to as a transistor MP2) coupled between the power supply voltage VM and the output terminal POUT2, and an N-channel MOS transistor MN2 (hereinafter, also simply referred to as a transistor MN2) coupled between the output terminal POUT2 and the ground voltage GNDP. In addition, there is shown the case where a first sub-drive part 120 that drives the transistors MP1 and MN1 in accordance with a control signal PIN1 and a second sub-drive part 122 that drives the transistors MP2 and MN2 in accordance with a control signal PIN2 are provided.

The source terminal and the back gate terminal of the transistors MP1 and MP2 are coupled to the power supply voltage VM, and the source terminal and the back gate terminal of the transistors MN1 and MN2 are coupled to the ground voltage GNDP.

The connection node of the transistors MP1 and MN1 is coupled to the output terminal POUT1, and the connection node of the transistors MP2 and MN2 is coupled to the output terminal POUT2. The gate terminals of the transistors MP1 and MN1 are coupled to the first sub-drive part 120. In addition, the gate terminals of the transistors MP2 and MN2 are coupled to the second sub-drive part 122.

Figure 3:
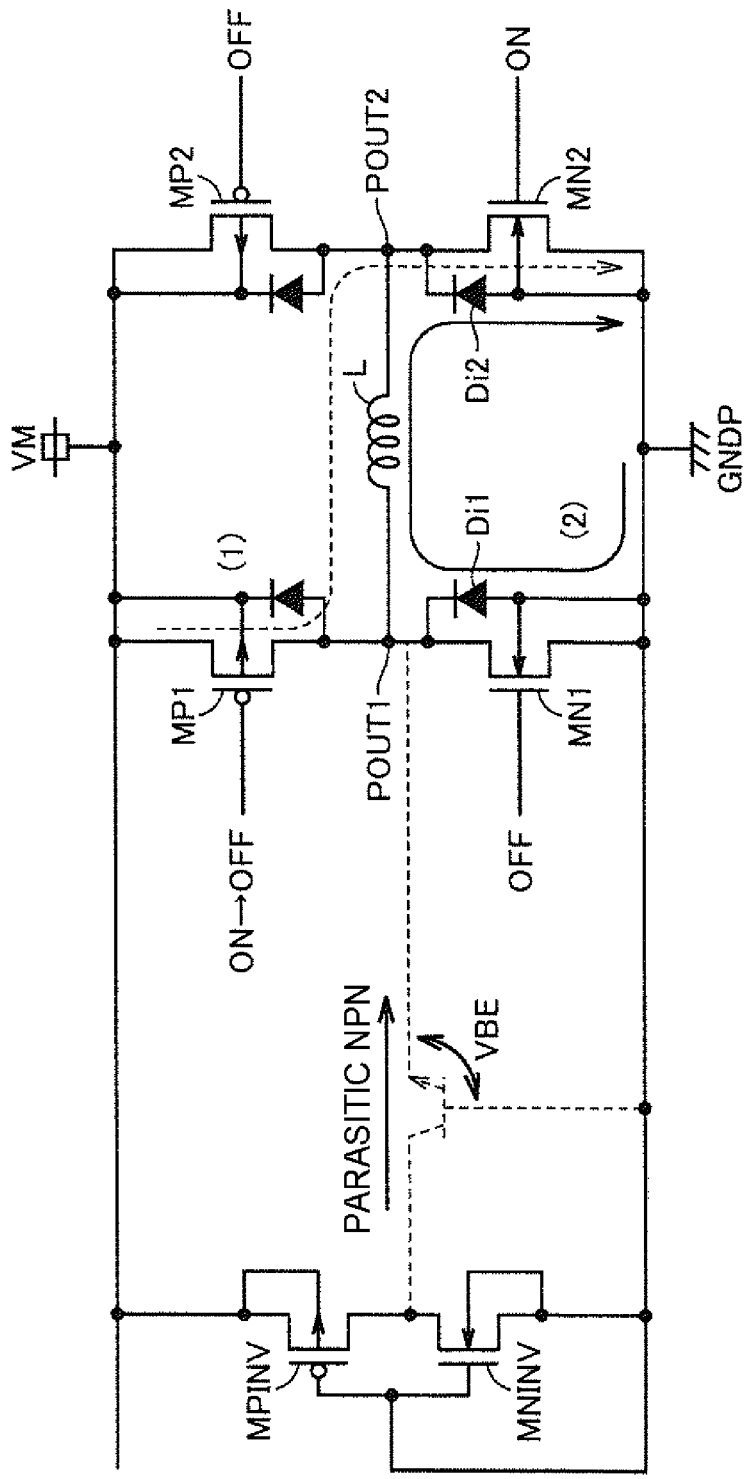
FIG. 3 is a diagram explaining a problematic point of the general motor driver 112 in a dead-off period.

FIG. 3 is a diagram explaining a problematic point of the general motor driver 112 in a dead-off period.

With reference to FIG. 3, the case of transiting from a state in which a current is supplied to the coil L (state (1)) to a state of high impedance, that is, a dead-off period provided for the purpose of what we call feedthrough-current prevention (state (2)), in a bridge circuit configured over a semiconductor device to which a coil L being an inductive load is coupled, is described.

By the transition of the transistor MP1 from the conductive (ON) state to the non-conductive (OFF) state, the transistor MP1 of the bridge circuit reaches the cut-off state.

Along with this, the coil L being the inductive load tries to cause a current to flow from the output terminal POUT1 toward the output terminal POUT2. That is, there is generated an inductive load current, which flows in the forward direction from the P-type region to the N-type region, via a parasitic diode Di1 of a PN-junction formed between the drain terminal and the back gate which are the construction of the transistor MN1, and which flows to the ground wiring via the coil L and the transistor MN2.

Consequently, in the output terminal POUT1 that is the terminal of the bridge circuit to which the coil L being the inductive load is coupled and that outputs a current, the voltage becomes a voltage lower than the ground voltage GNDP by the forward voltage of the PN-junction.

In a semiconductor element for use in the circuit configured over the semiconductor device, a parasitic transistor or a parasitic diode is formed. Then, in order to prevent a leak current unnecessary for the semiconductor element, generally a back gate is coupled to the power source or a ground voltage so as to be reverse bias relative to the PN-junction.

In contrast, when a voltage less than the ground voltage GNDP is generated in the wiring of a circuit configured over the semiconductor device, an unnecessary leak current may be generated via the parasitic transistor or the parasitic diode, and thus an abnormal operation of the circuit may be caused.

Figure 4:
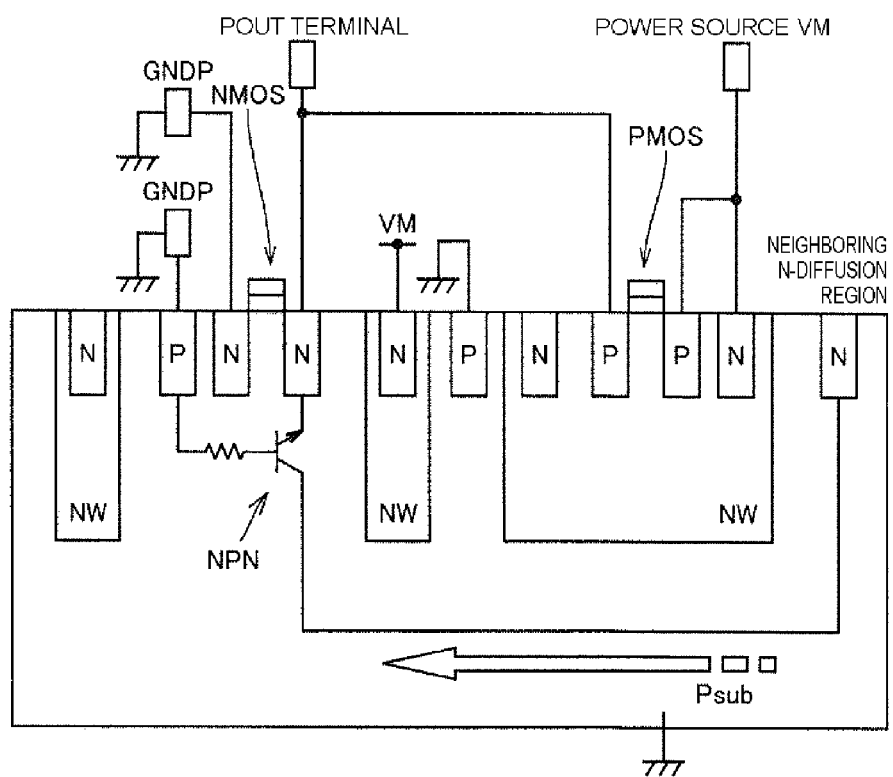
FIG. 4 is a diagram explaining a part of the semiconductor structure of the general motor driver 112.

FIG. 4 is a diagram explaining a part of the semiconductor structure of the general motor driver 112.

With reference to FIG. 4, here, there is shown a semiconductor structure in which the transistor MP1 being a P-channel MOS transistor and the transistor MN1 being an N-channel MOS transistor are formed over a P-substrate (Psub).

Here, there is shown the case where a parasitic transistor NPN is formed by a neighboring N-diffusion region, the N-diffusion region of the transistor MN1 coupled to the POUT terminal and a P-diffusion region of another semiconductor element.

In the present example, in the case where the parasitic transistor NPN is generated, when the voltage of an emitter of the parasitic transistor becomes lower than the ground voltage GNDP, potential difference of a base-emitter voltage VBE is generated. Consequently, the parasitic transistor NPN becomes conductive (ON).

With reference to FIG. 3, again, for example, when the parasitic transistor NPN becomes conductive, a leak current may flow into the output terminal POUT1 from the connection node between the transistor MPINV and the transistor MNINV being semiconductor elements. In that case, there may be caused a malfunction such as an inversion of the voltage level of the node held between the transistor MPINV and the transistor MNINV.

Figure 5:
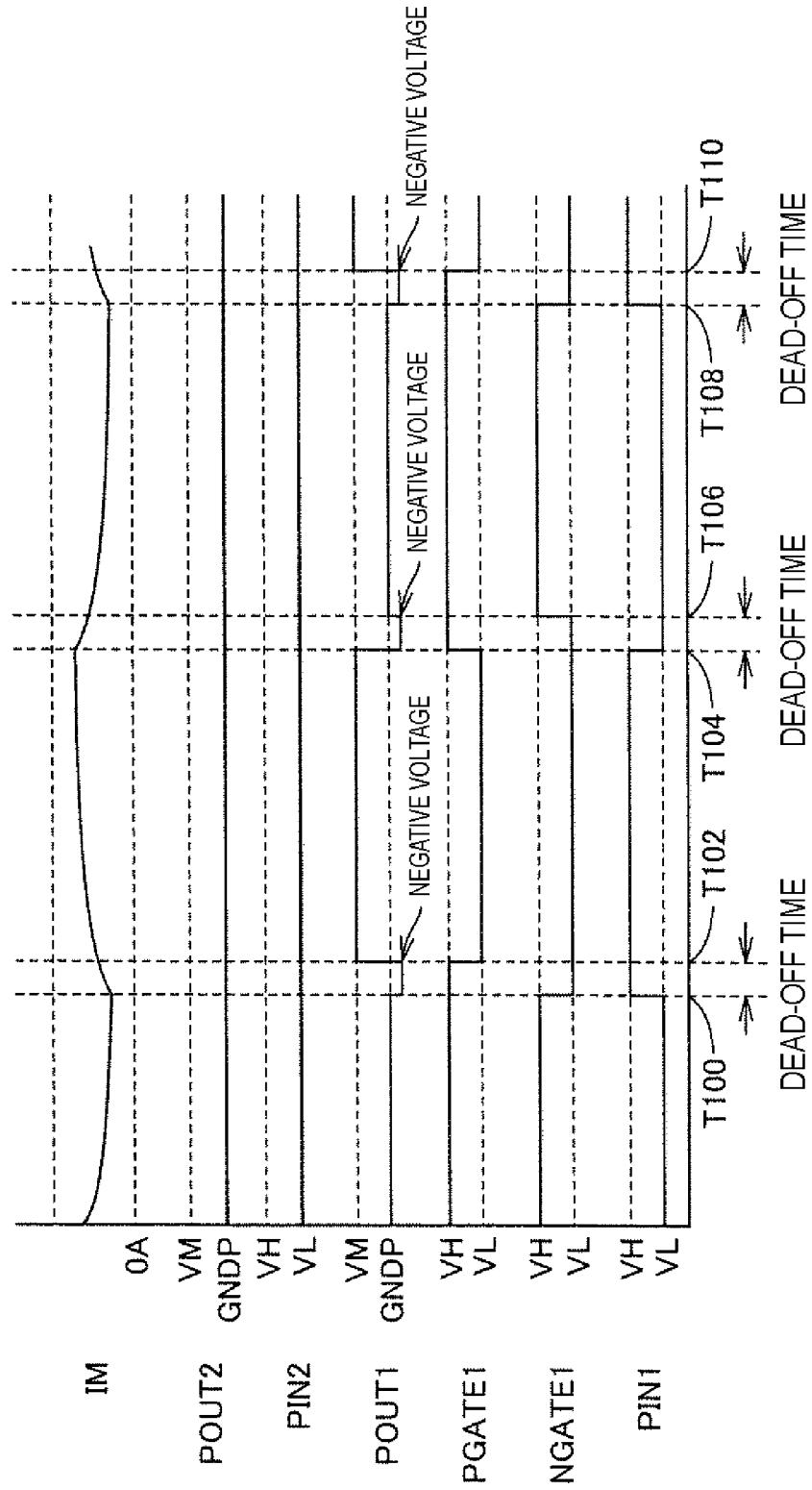
FIG. 5 is a timing chart explaining the operation state associated with the drive of the general motor driver 112.

FIG. 5 is a timing chart explaining the operation state associated with the drive of the general motor driver 112.

With reference to FIG. 5, here, there are shown a current IM flowing through the inductive load, and the voltage levels of the output terminals POUT1 and POUT2, control signals PIN1 and PIN2, and gate terminals PGATE1 and NGATE1.

Here, the control signal PIN2 is fixed at an "L" level (VL). In accordance with the control signal PIN2 (at the "L" level), it is assumed that the transistor MP2 is fixed to a non-conductive (OFF) state and the transistor MN2 is fixed to a conductive (ON) state.

In addition, in accordance with the rising or falling of the control signal PIN1, the gate terminals of the transistors MP1 and MN1 are controlled. Specifically, in accordance with the rising from the "L" level (VL) to an "H" level (VH) of the control signal PIN1, the gate terminal of the transistor MN1 (NGATE1) is set to the "L" level. Furthermore, after the lapse of a dead-off time period, the gate terminal of the transistor MP1 (PGATE1) is set to the "L" level. Moreover, in accordance with the falling from the "H" level to the "L" level of the control signal PIN1, the gate terminal of the transistor MP1 (PGATE1) is set to the "H" level. In addition, after the lapse of a dead-off time period, the gate terminal of the transistor MN1 (NGATE1) is set to the "H" level.

In the present example, at time T100, the control signal PIN1 makes a transition to the "H" level. Along with this, the gate terminal of the transistor MN1 (NGATE1) is set to the "L" level. Then, the transistor MN1 is brought into a non-conductive (OFF) state. In addition, at time T102 after the lapse of the dead-off time period, the gate terminal of the transistor MP1 (PGATE1) is set to the "L" level. Along with this, the transistor MP1 is brought into a conductive (ON) state.

In the dead-off time period between the time T100 and the time T102, since an inductive load current is generated in the coil L, the voltage of the output terminal POUT1 makes a transition to a voltage lower than the ground voltage GNDP by the forward voltage of the diode.

In the same manner, at time T104, the control signal PIN1 makes a transition to the "L" level. Along with this, the gate terminal of the transistor MP1 (PGATE1) makes a transition from the "L" level to the "H" level. Then, the transistor MP1 is brought into a non-conductive (OFF) state. In addition, at time T106 after the lapse of the dead-off time period, the gate terminal of the transistor MN1 (NGATE1) makes a transition from the "L" level to the "H" level. Along with this, the transistor MN1 is brought into a conductive (ON) state.

In the dead-off time period between the time T104 and the time T106, since an inductive load current is generated in the coil L, the voltage of the output terminal POUT1 makes a transition to a voltage lower than the ground voltage GNDP by the forward voltage of the diode.

In addition, in the same manner, at time T108, the control signal PIN2 makes a transition to the "H" level. Along with this, the gate terminal of the transistor MN1 (NGATE1) makes a transition to the "L" level. Furthermore, the transistor MN1 is brought into a non-conductive (OFF) state. Moreover, at time T110 after the lapse of the dead-off time period, the gate terminal of the transistor MP1 (PGATE1) is set to the "L" level. Along with this, the transistor MP1 is brought into a conductive (ON) state.

In the dead-off time period between the time T108 and the time T110, since an inductive load current is generated in the coil L, the voltage of the output terminal POUT1 makes a transition to a voltage lower than the ground voltage GNDP by the forward voltage of the diode.

Accordingly, in the dead-off time period when the transistor MN1 or the transistor MP1 is brought into a non-conductive (OFF) state according to the control signal PIN1, since the output terminal POUT1 is caused to have a voltage lower than the ground voltage GNDP, the parasitic transistor may become conductive and a leak current may flow in.

In the present First Embodiment, there is described a system of suppressing a leak current to thereby suppress interference, in the dead-off time period in a semiconductor device that drives an inductive load or a capacitive load.

(First Embodiment)

Figure 6:
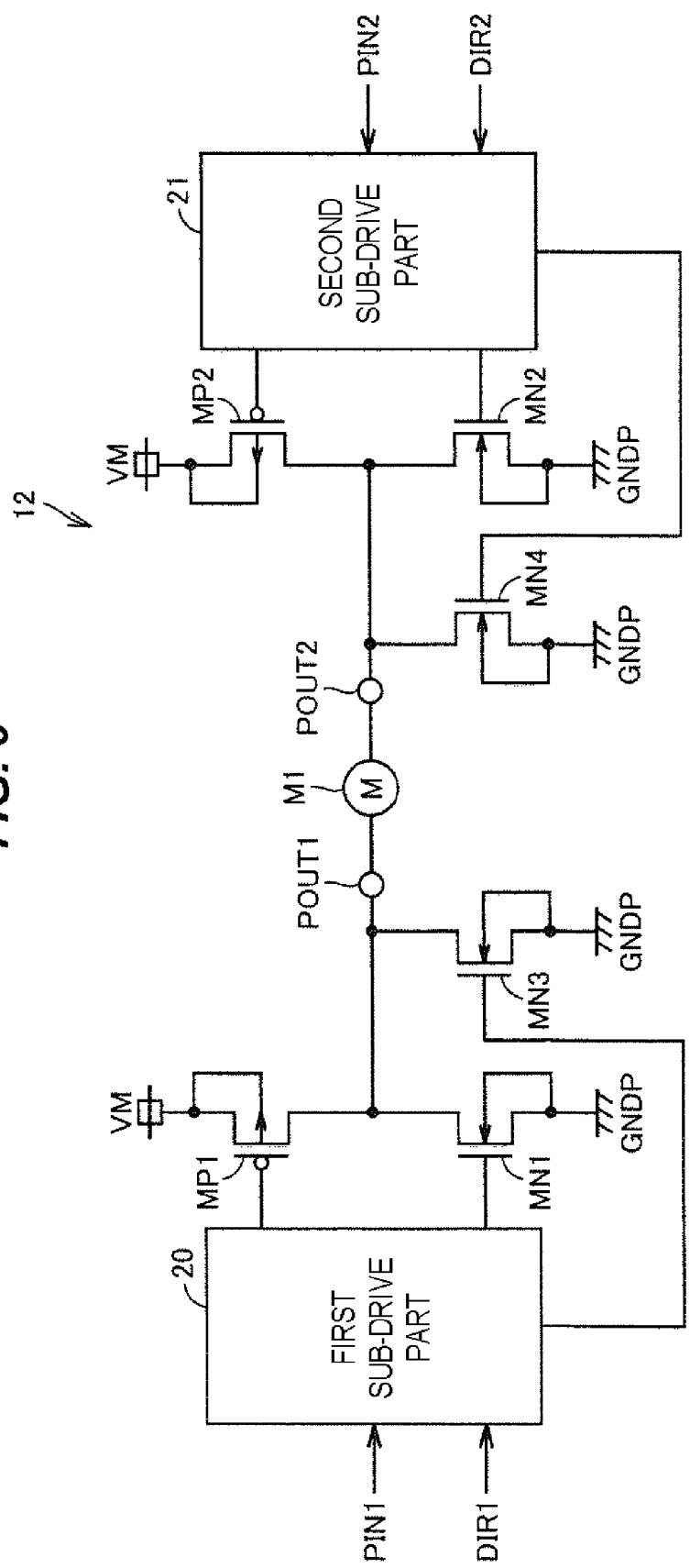
FIG. 6 is a diagram explaining the configuration of a motor driver 12 according to the present First Embodiment.

FIG. 6 is a diagram explaining the configuration of a motor driver 12 according to the present First Embodiment.

With reference to FIG. 6, the motor driver 12 includes the P-channel MOS transistor MP1 coupled between the power supply voltage VM and the output terminal POUT1, and the N-channel MOS transistor MN1 coupled between the output terminal POUT1 and the ground voltage GNDP. In addition, the motor driver includes the P-channel MOS transistor MP2 coupled between the power supply voltage VM and the output terminal POUT2, and the N-channel MOS transistor MN2 coupled between the output terminal POUT2 and the ground voltage GNDP.

Furthermore, the analog logic circuit 10 includes a first sub-drive part 20 that drives the transistors MP1 and MN1 in accordance with the control signal PIN1, and a second sub-drive part 21 that drives the transistors MP2 and MN2 in accordance with the control signal PIN2. Moreover, the first sub-drive part 20 drives a bypass transistor MN3 being an N-channel MOS transistor to be described. In addition, the second sub-drive part 21 drives a bypass transistor MN4 being an N-channel MOS transistor to be described.

The source terminals and the back gate terminals of the transistors MP1 and MP2 are coupled to the power supply voltage VM, and the source terminals and the back gate terminals of the transistors MN1 and MN2 are coupled to the ground voltage GNDP.

The connection node of the transistors MP1 and MN1 is coupled to the output terminal POUT1, and the connection node of the transistors MP2 and MN2 is coupled to the output terminal POUT2. The gate terminals of the transistors MP1 and MN1 are coupled to the first sub-drive part 20. In addition, the gate terminals of the transistors MP2 and MN2 are coupled to the second sub-drive part 21.

Moreover, a bypass transistor MN3 coupled between the ground voltage GNDP and the output terminal POUT1, and a bypass transistor MN4 coupled between the ground voltage GNDP and the output terminal POUT2 are further provided.

In the present example, the bypass transistor MN3 or the bypass transistor MN4 is set to a conductive (ON) state in the dead-off time period.

Figure 7:
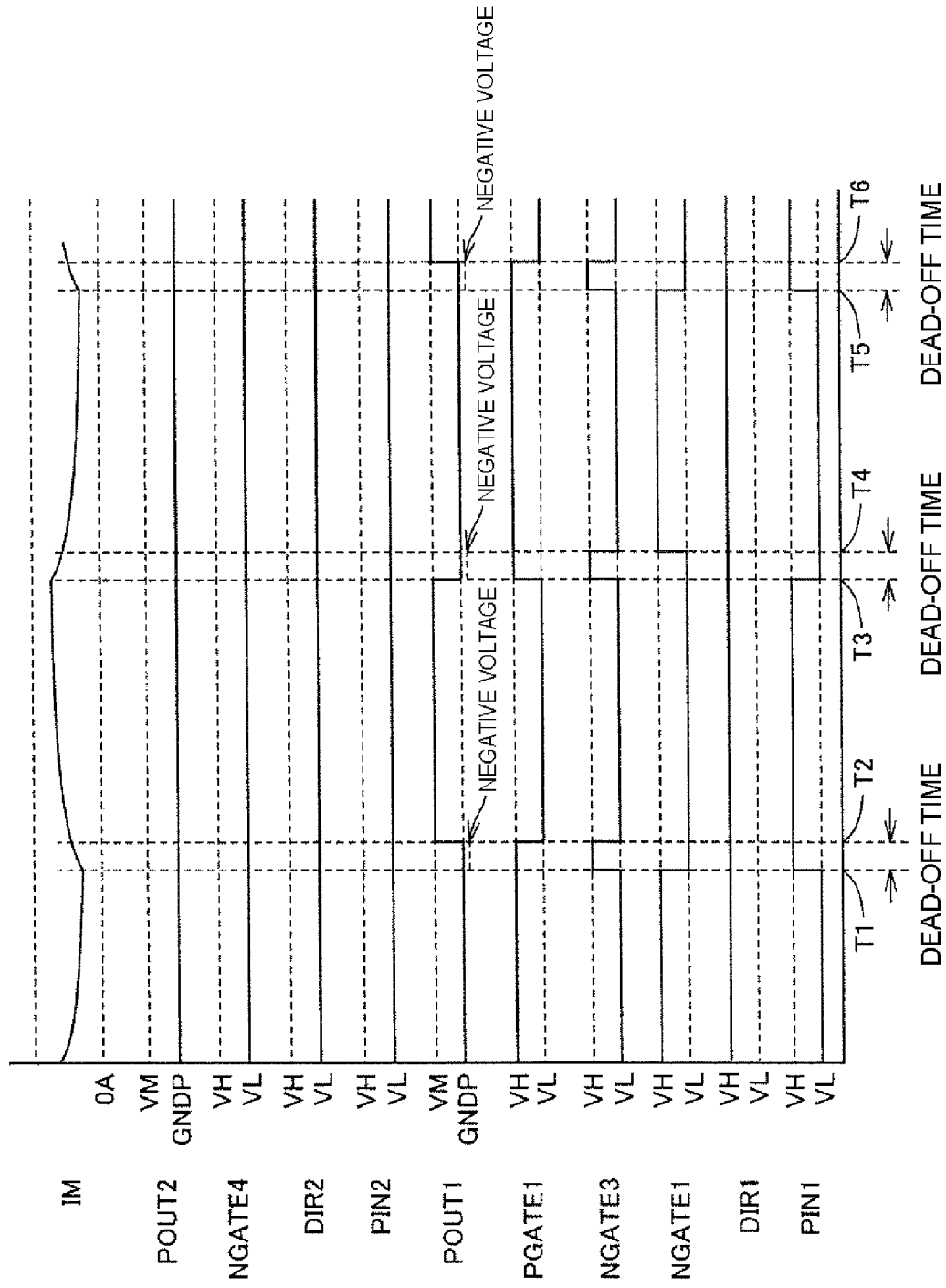
FIG. 7 is a timing chart explaining the operation state associated with the drive of the motor driver 12 according to the present First Embodiment.

FIG. 7 is a timing chart explaining the operation state associated with the drive of the motor driver 12 according to the present First Embodiment.

With reference to FIG. 7, here, there are shown the current IM flowing to the inductive load, and the voltage levels of the output terminals POUT1 and POUT2, of the control signals PIN1 and PIN2, of the gate terminals PGATE1, NGATE1, NGATE3 and NGATE4, and of the control signals DIR1 and DIR2. Here, the control signal PIN2 is fixed at the "L" level. In accordance with the control signal PIN2 (at the "L" level), it is assumed that the transistor MP2 is fixed to a non-conductive (OFF) state and the transistor MN2 is fixed to a conductive (ON) state.

In addition, in accordance with the rising or falling of the control signal PIN1, the gate terminals of the transistors MP1 and MN1 are controlled. Specifically, in accordance with the rising of the control signal PIN1 from the "L" level to the "H" level, the gate terminal of the transistor MN1 (NGATE1) is set to the "L" level. Furthermore, after the lapse of the dead-off time period, the gate terminal of the transistor MP1 (PGATE1) is set to the "L" level. Moreover, in accordance with the falling of the control signal PIN1 from the "H" level to the "L" level, the gate terminal of the transistor MP1 (PGATE1) is set to the "H" level. In addition, after the lapse of the dead-off time period, the gate terminal of the transistor MN1 (NGATE1) is set to the "H" level.

Moreover, the control signals DIR1 and DIR2 are used as a selection signal that selects a sub-drive part driving a bypass transistor. Specifically, the control signals DIR1 and DIR2 are in a mutually complementary relation, and, when selecting the first sub-drive part 20 to thereby drive the bypass transistor, the control signal DIR1 is set to the "H" level, and the control signal DIR2 is set to the "L" level. In addition, when selecting the second sub-drive part 21 to thereby drive the bypass transistor, it is assumed that the control signal DIR1 is set to the "L" level, and the control signal DIR2 is set to the "H" level.

In the present example, it is assumed that the control signal DIR2 is set to the "L" level. That is, it is assumed that the control signal DIR1 is set to the "H" level. That is, a current is assumed to flow from the output terminal POUT1 to the output terminal POUT2.

In the present example, the bypass transistor is controlled on the basis of the combination of the control signals DIR1 and DIR2, and the control signals PIN1 and PIN2.

At the time T1, the control signal PIN1 makes a transition to the "H" level. Along with this, the gate terminal of the transistor MN1 (NGATE1) is set to the "L" level. Then, the transistor MN1 is brought into a non-conductive (OFF) state. In addition, at the time T2 after the lapse of the dead-off time period, the gate terminal of the transistor MP1 (PGATE1) is set to the "L" level. Along with this, the transistor MP1 is brought into a conductive (ON) state.

In the dead-off time period between the time T1 and the time T2, the first sub-drive part 20 sets the gate terminal of the bypass transistor MN3 (NGATE3) to the "H" level on the basis of the control signals PIN1 and DIR1. Along with this, the bypass transistor MN3 is brought into a conductive (ON) state. Accordingly, the output terminal POUT1 is joined electrically to the ground voltage GNDP. Therefore, even when an inductive load current is generated in the coil L, the voltage does not make a transition to a voltage lower than that of the output terminal POUT1 by the forward voltage of the diode.

In the same manner, at the time T3, the control signal PIN1 makes a transition to the "L" level. Along with this, the gate terminal of the transistor MP1 (PGATE1) makes a transition from the "L" level to the "H" level. Then, the transistor MP1 is brought into a non-conductive (OFF) state. In addition, at the time T4 after the lapse of the dead-off time period, the gate terminal of the transistor MN1 (NGATE1) makes a transition from the "L" level to the "H" level. Along with this, the transistor MN1 is brought into a conductive (ON) state.

In the dead-off time period between the time T3 and the time T4, the first sub-drive part 20 sets the gate terminal of the bypass transistor MN3 (NGATE3) to the "H" level on the basis of the control signals PIN1 and DIR1. Along with this, the bypass transistor MN3 is brought into a conductive (ON) state. Accordingly, the output terminal POUT1 is joined electrically to the ground voltage GNDP. Therefore, even when an inductive load current is generated in the coil L, the voltage does not make a transition to a voltage lower than that of the output terminal POUT1 by the forward voltage of the diode.

Moreover, in the same manner, at the time T5, the control signal PIN1 makes a transition to the "H" level. Along with this, the gate terminal of the transistor MN1 (NGATE1) makes a transition to the "L" level. Then, the transistor MN1 is brought into a non-conductive (OFF) state. In addition, at the time T6 after the lapse of the dead-off time period, the gate terminal of the transistor MP1 (PGATE1) makes a transition to the "L" level. Along with this, the transistor MP1 is brought into a conductive (ON) state.

In the dead-off time period between the time T5 and the time T6, the first sub-drive part 20 sets the gate terminal of the bypass transistor MN3 (NGATE3) to the "H" level on the basis of the control signals PIN1 and DIR1. Along with this, the bypass transistor MN3 is brought into a conductive (ON) state. Accordingly, the output terminal POUT1 is joined electrically to the ground voltage GNDP. Therefore, even when an inductive load current is generated in the coil L, the voltage does not make a transition to a voltage lower than that of the output terminal POUT1 by the forward voltage of the diode.

Consequently, it becomes possible to prevent the generation of an unnecessary leak current that induces a malfunction of the circuit in the dead-off time period, because a reflux current (an inductive load current) flows via not the transistor MN1 but the bypass transistor MN3. That is, in the period when the transistor MN1 is brought into a cut-off state, which is the generation factor of an unnecessary leak current, a current that generates the forward voltage of the PN-junction going through the back gate is supplied via the bypass transistor MN3. Consequently, by reducing the generation of a forward voltage, it is possible to reduce a phenomenon in which the voltage of the output terminal falls below the ground voltage, to thereby suppress the generation of an unnecessary leak current and to prevent the malfunction (interference) of the circuit.

(Modification of First Embodiment)

Figure 8:
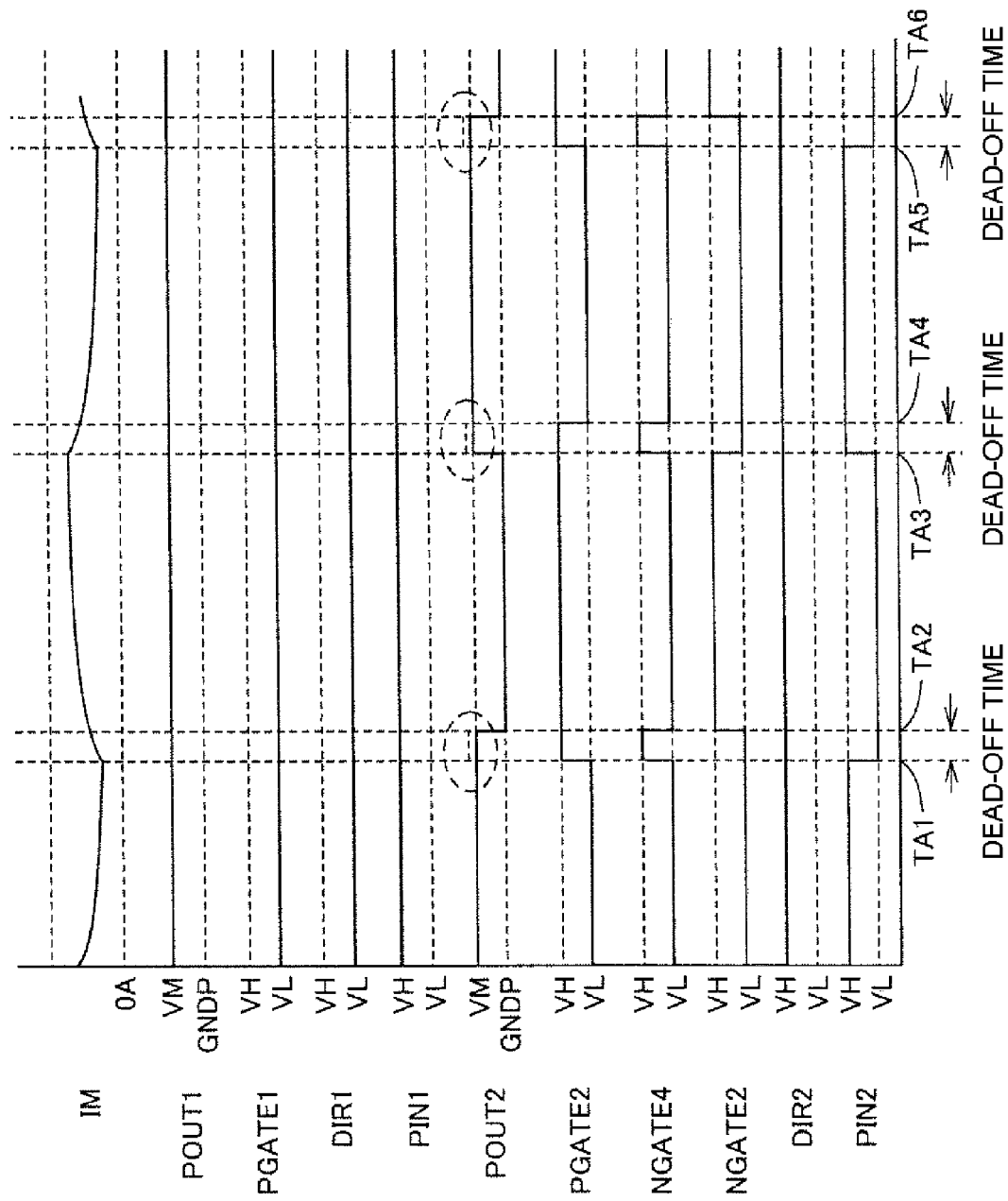
FIG. 8 is a timing chart explaining the operation state in accordance with the drive of the motor driver 12 according to a modification of the present First Embodiment.

FIG. 8 is a timing chart explaining the operation state according to the drive of the motor driver 12 according to a modification of the present First Embodiment.

With reference to FIG. 8, here, there are shown the current IM flowing through the inductive load, and the voltage levels of the output terminals POUT1 and POUT2, of the control signals PIN1 and PIN2, of the gate terminals PGATE1, NGATE2, PGATE2 and NGATE4, and of the control signals DIR1 and DIR2.

Here, the control signal PIN1 is fixed at the "H" level. In accordance with the control signal PIN1 (at the "H" level), it is assumed that the transistor MP1 is fixed to a conductive (ON) state and the transistor MN1 is fixed to a non-conductive (OFF) state.

In addition, in accordance with the rising or falling of the control signal PIN2, the gate terminals of the transistors MP2 and MN2 are controlled. Specifically, in accordance with the rising of the control signal PIN2 from the "L" level to the "H" level, the gate terminal of the transistor MN2 (NGATE2) is set to the "L" level. Furthermore, after the lapse of the dead-off period, the gate terminal of the transistor MP2 (PGATE2) is set to the "L" level. Moreover, in accordance with the falling of the control signal PIN2 from the "H" level to the "L" level, the gate terminal of the transistor MP2 (PGATE2) is set to the "H" level. In addition, after the lapse of the dead-off period, the gate terminal of the transistor MN2 (NGATE2) is set to the "H" level.

In the present example, it is assumed that the control signal DIR1 is set to the "L" level and the control signal DIR2 is set to the "H" level.

At time T1A, the control signal PIN2 makes a transition to the "L" level. Along with this, the gate terminal of the transistor MP2 (PGATE2) makes a transition to the "H" level. Then, the transistor MP2 is brought into a non-conductive (OFF) state. In addition, at time T2A after the lapse of the dead-off time period, the gate terminal of the transistor MN2 (NGATE2) is set to the "H" level. Along with this, the transistor MN2 is brought into a conductive (ON) state.

Here, in the bridge circuit configured over the semiconductor device to which the coil L being the inductive load is coupled, the case where the transition has occurred from a state in which a current is supplied to the coil L being the inductive load to a state of high impedance, that is, to the dead-off period provided for the purpose of what we call feedthrough-current prevention, is described.

As the result of the transition of the transistor MN2 from a conductive (ON) state to a non-conductive (OFF) state, the transistor MN2 of the bridge circuit is brought into a cut-off state.

Along with this, the coil L being the inductive load tries to cause a current to flow from the output terminal POUT1 toward the output terminal POUT2. That is, an inductive load current is generated and flows in the forward direction from the P-type region to the N-type region via a parasitic diode of a PN-junction formed between the drain terminal and the back gate being the structure of the transistor MP2, and a current flows to a power source wiring via the coil L and the transistor MP2.

Consequently, in the output terminal POUT2 that is a terminal of a bridge circuit to which the coil L being the inductive load is coupled and that outputs a current, the voltage becomes a voltage higher than the power supply voltage VM by the forward voltage of the PN-junction (the dotted line region part in the present example). Also in this case, since the output terminal POUT2 is caused to have a voltage higher than the power supply voltage VM in the dead-off time period when the transistor is brought into a non-conductive (OFF) state, the parasitic transistor may become conductive and the leak current may flow in.

Therefore, in the present example, in the dead-off time period between the time T1A and the time T2A, the second sub-drive part 21 sets the gate terminal of a bypass transistor MN4 (NGATE4) to the "H" level on the basis of the control signals PIN2 and DIR2. Along with this, the bypass transistor MN4 is brought into a conductive (ON) state. Accordingly, the output terminal POUT2 is joined electrically to the ground voltage GNDP.

In the present example, so that there is not generated the transition to a voltage higher than that of the output terminal POUT2 by the forward voltage of the diode in accordance with the inductive load current, the bypass transistor MN4 is pulled down in a conductive (ON) state. Consequently, the raise to a voltage higher than the power supply voltage VM is suppressed.

In the same manner, at time T3A, the control signal PIN2 makes a transition to the "H" level. Along with this, the gate terminal of the transistor MN2 (NGATE2) makes a transition from the "H" level to the "L" level. Then, the transistor MN2 is brought into a non-conductive (OFF) state. In addition, at time T4A after the lapse of the dead-off time period, the gate terminal of the transistor MP2 (PGATE2) makes a transition from the "H" level to the "L" level. Along with this, the transistor MP2 is brought into a conductive (ON) state.

In the dead-off time period between the time T3A and the time T4A, the second sub-drive part 21 sets the gate terminal of the bypass transistor MN4 (NGATE4) to the "H" level on the basis of the control signals PIN2 and DIR2. Along with this, the bypass transistor MN4 is brought into a conductive (ON) state. Accordingly, the output terminal POUT2 is joined electrically to the ground voltage GNDP.

In the present example, so that there is not generated the transition to a voltage higher than that of the output terminal POUT2 by the forward voltage of the diode in accordance with the inductive load current, the bypass transistor MN4 is pulled down in a conductive (ON) state. Consequently, the raise to a voltage higher than the power supply voltage VM is suppressed.

In addition, in the same manner, at time T5A, the control signal PIN2 makes a transition to the "L" level. Along with this, the gate terminal of the transistor MP2 (PGATE2) makes a transition to the "H" level. Then, the transistor MP2 is brought into a non-conductive (OFF) state. Furthermore, at time T6A after the lapse of the dead-off time period, the gate terminal of the transistor MN2 (NGATE2) makes a transition to the "H" level. Along with this, the transistor MN2 is brought into a conductive (ON) state.

In the dead-off time period between the time T5A and the time T6A, the second sub-drive part 21 sets the gate terminal of the bypass transistor MN4 (NGATE4) to the "H" level on the basis of the control signals PIN2 and DIR2. Along with this, the bypass transistor MN4 is brought into a conductive (ON) state. Accordingly, the output terminal POUT2 is joined electrically to the ground voltage GNDP.

In the present example, so that there is not generated the transition to a voltage higher than that of the output terminal POUT2 by the forward voltage of the diode in accordance with the inductive load current, the bypass transistor MN4 is pulled down in a conductive (ON) state. Consequently, the raise to a voltage higher than the power supply voltage VM is suppressed.

Consequently, it becomes possible to prevent the generation of an unnecessary leak current that induces a malfunction of the circuit in the dead-off time period, because a reflux current (an inductive load current) flows via not the transistor MP2 but the transistor MN4. That is, in the period when the transistor MP2 is brought into a cut-off state, which is the generation factor of an unnecessary leak current, a current that generates the forward voltage of the PN-junction going through the back gate is supplied via the bypass transistor MN4. Consequently, by reducing the generation of a forward voltage, it is possible to reduce a phenomenon in which the voltage of the output terminal exceeds the power supply voltage, to thereby suppress the generation of an unnecessary leak current and to prevent the malfunction (interference) of the circuit.

(Second Embodiment)

Figure 9:
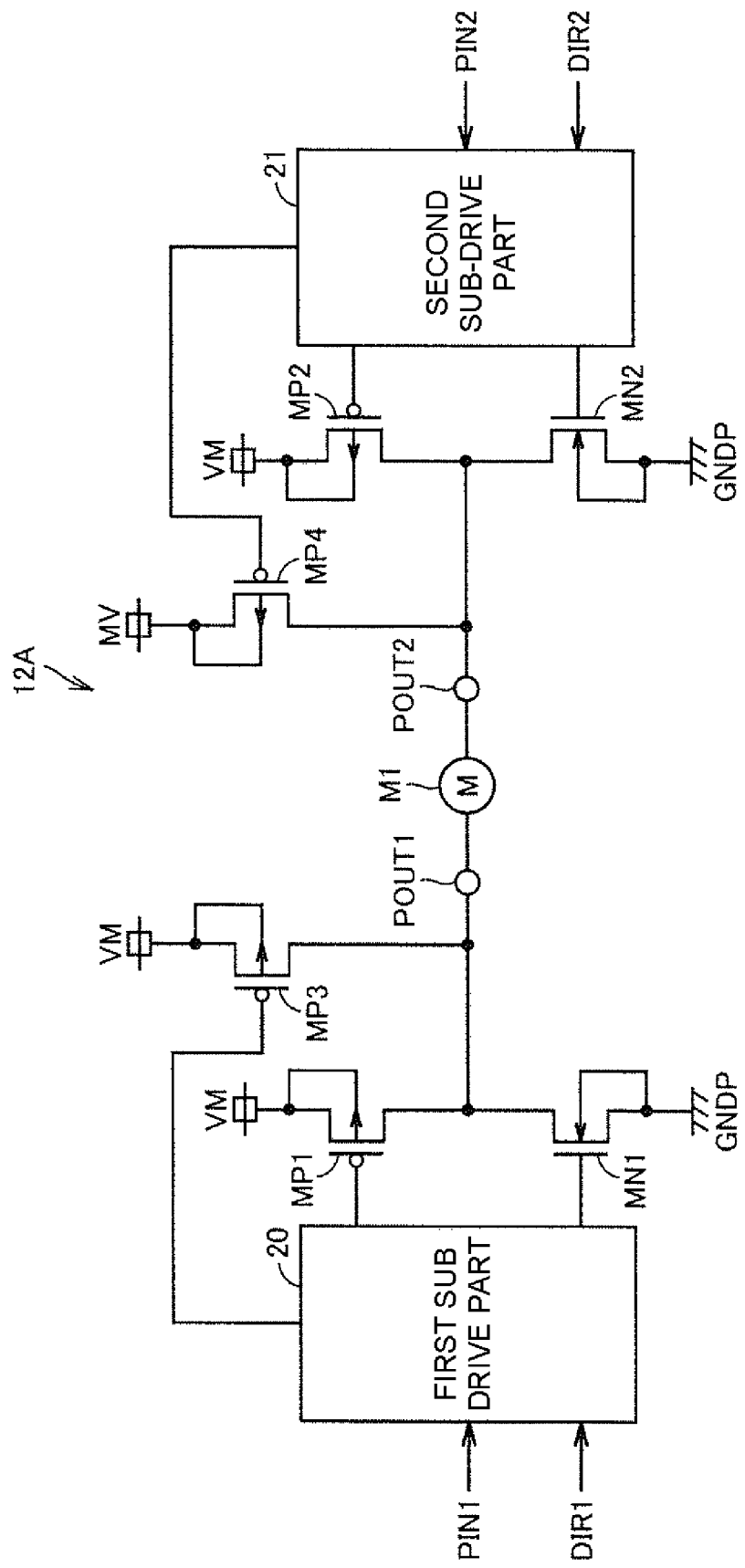
FIG. 9 is a diagram explaining the configuration of a motor driver 12A according to the present Second Embodiment.

FIG. 9 is a diagram explaining the configuration of a motor driver 12A according to the present Second Embodiment.

With reference to FIG. 9, as compared with the motor driver 12 in FIG. 6, a motor driver 12A is different in that bypass transistors MP3 and MP4 are provided, in place of the bypass transistors MN3 and MN4. Other points are the same, and thus the detailed explanation thereof is not repeated.

The bypass transistor MP3 is coupled between the power supply voltage VM and the output terminal POUT1, and the gate thereof is coupled to the first sub-drive part 20. The bypass transistor MP4 is coupled between the power supply voltage VM and the output terminal POUT2, and the gate thereof is coupled to the second sub-drive part 21.

In the example, the bypass transistor MP3 or the bypass transistor MP4 is set to a conductive (ON) state in the dead-off time period.

Figure 10:
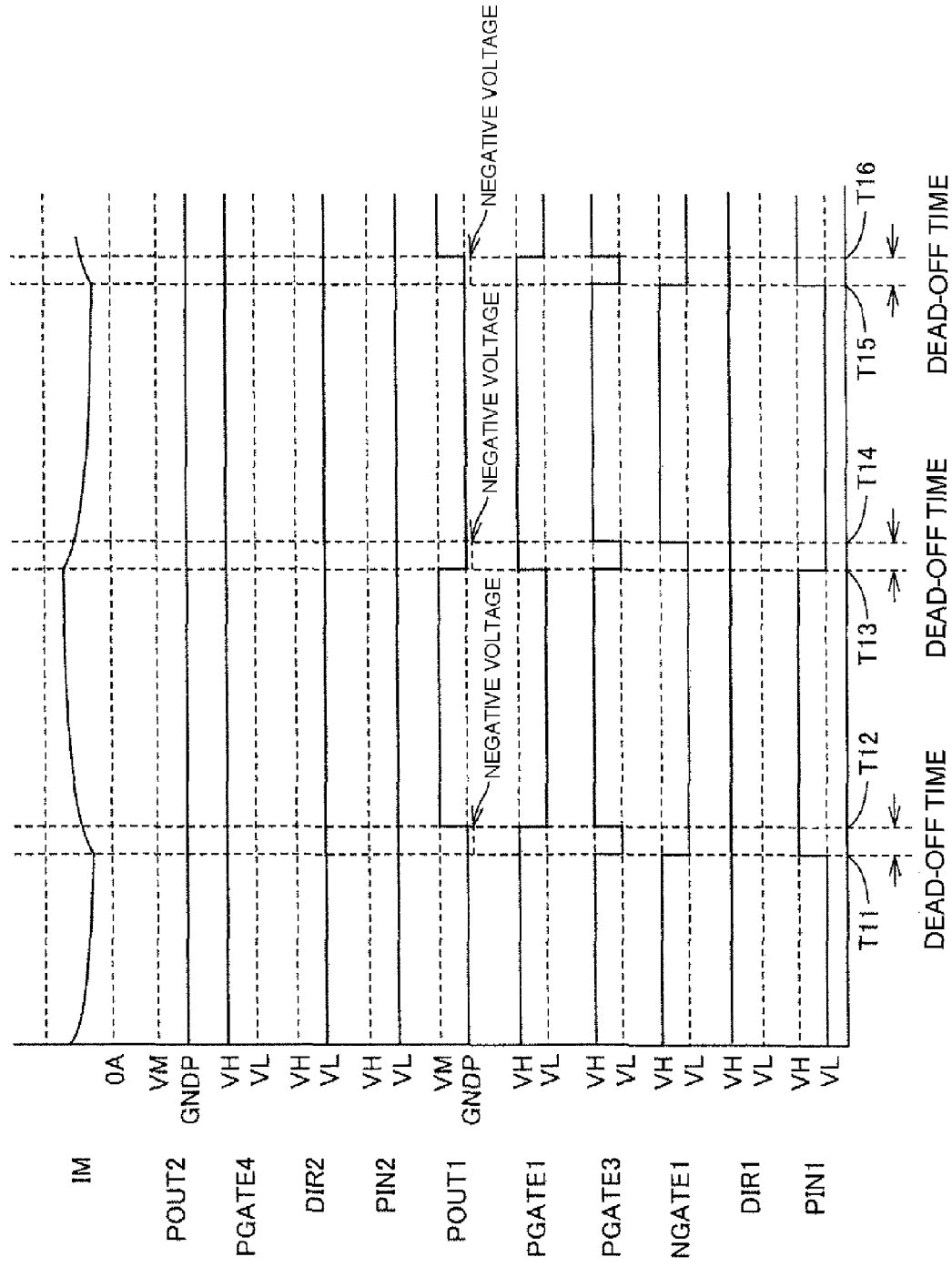
FIG. 10 is a timing chart explaining the operation state associated with the drive of the motor driver 12A according to the present Second Embodiment.

FIG. 10 is a timing chart explaining the operation state associated with the drive of the motor driver 12A according to the present Second Embodiment.

With reference to FIG. 10, here, there are shown the current IM flowing to the inductive load, and the voltage levels of the output terminals POUT1 and POUT2, of the control signals PIN1 and PIN2, of the gate terminals PGATE1, NGATE1, PGATE3 and PGATE4, and of the control signals DIR1 and DIR2.

Here, the control signal PIN2 is fixed at the "L" level. According to the control signal PIN2 (at the "L" level), it is assumed that the transistor MP2 is fixed to a non-conductive (OFF) state and the transistor MN2 is fixed to a conductive (ON) state.

In addition, in accordance with the control signal PIN1, the gate terminals of the transistors MP1 and MN1 are controlled. Specifically, in accordance with the rising of the control signal PIN1 from the "L" level to the "H" level, the gate terminal of the transistor MN1 is set to the "L" level. Furthermore, after the lapse of the dead-off time period, the gate terminal of the transistor MP1 is set to the "L" level. Moreover, in accordance with the falling of the control signal PIN1 from the "H" level to the "L" level, the gate terminal of the transistor MP1 is set to the "H" level. In addition, after the lapse of the dead-off time period, the gate terminal of the transistor MN1 is set to the "H" level.

In the present example, it is assumed that the control signal DIR1 is set to the "H" level and the control signal DIR2 is set to the "L" level.

At time T11, the control signal PIN1 makes a transition to the "H" level. Along with this, the gate terminal of the transistor MN1 (NGATE1) makes a transition to the "L" level. Then, transistor MN1 is brought into a non-conductive (OFF) state. Furthermore, at time T12 after the lapse of the dead-off time period, the gate terminal of the transistor MP1 (PGATE1) makes a transition to the "L" level. Along with this, the gate terminal of the transistor MP1 (PGATE1) is brought into a conductive (ON) state.

In the dead-off time period between the time T11 and the time T12, the first sub-drive part 20 sets the gate terminal of the bypass transistor MP3 (PGATE3) to the "L" level on the basis of the control signals PIN1 and DIR1. Along with this, the bypass transistor MP3 is brought into a conductive (ON) state. Accordingly, the output terminal POUT1 is joined electrically to the power supply voltage VM.

In the present example, so that there is not generated the transition to a voltage lower than that of the output terminal POUT1 by the forward voltage of the diode in accordance with the inductive load current, the bypass transistor MP3 is pulled up in a conductive (ON) state. Consequently, the fall of the voltage lower than the ground voltage GNDP is suppressed.

In the same manner, at time T13, the control signal PIN2 makes a transition to the "L" level. Along with this, the gate terminal of the transistor MP1 (PGATE1) makes a transition from the "L" level to the "H" level. In addition, the transistor MP1 is brought into a non-conductive (OFF) state. And, at time T14 after the lapse of the dead-off time period, the gate terminal of the transistor MN1 (NGATE1) makes a transition from the "L" level to the "H" level. Along with this, the transistor MN1 is brought into a conductive (ON) state.

In the dead-off time period between the time T13 and the time T14, the first sub-drive part 20 sets the gate terminal of the bypass transistor MP3 (PGATE3) to the "L" level on the basis of the control signals PIN1 and DIR1. Along with this, the bypass transistor MP3 is brought into a conductive (ON) state. Accordingly, the output terminal POUT1 is joined electrically to the power supply voltage VM.

In the present example, so that there is not generated the transition to a voltage lower than that of the output terminal POUT1 by the forward voltage of the diode in accordance with the inductive load current, the bypass transistor MP3 is pulled up in a conductive (ON) state. Consequently, the fall of the voltage lower than the ground voltage GNDP is suppressed.

In addition, in the same manner, at time T15, the control signal PIN2 makes a transition to the "H" level. Along with this, the gate terminal of the transistor MN1 (NGATE1) makes a transition to the "L" level. Then, transistor MN1 is brought into a non-conductive (OFF) state. Furthermore, at time T16 after the lapse of the dead-off time period, the gate terminal PGATE1 of the transistor MP1 makes a transition to the "L" level. Along with this, the transistor MP1 is brought into a conductive (ON) state.

In the dead-off time period between the time T15 and the time T16, the first sub-drive part 20 sets the gate terminal of the bypass transistor MP3 (PGATE3) to the "L" level on the basis of the control signals PIN1 and DIR1. Along with this, the bypass transistor MP3 is brought into a conductive (ON) state. Accordingly, the output terminal POUT1 is joined electrically to the power supply voltage VM.

In the present example, so that there is not generated the transition to a voltage lower than that of the output terminal POUT1 by the forward voltage of the diode in accordance with the inductive load current, the bypass transistor MP3 is pulled up in a conductive (ON) state. Consequently, the fall of the voltage lower than the ground voltage GNDP is suppressed.

Consequently, it becomes possible to prevent the generation of an unnecessary leak current that causes abnormal operation of the circuit in the dead-off time period, because a reflux current (an inductive load current) flows via not the transistor MN1 but the transistor MP3. That is, in the period when the transistor MN1 is brought into a cut-off state, which is the generation factor of an unnecessary leak current, a current that generates the forward voltage of the PN-junction going through the back gate is supplied via the bypass transistor MP3. Consequently, by reducing the generation of a forward voltage, it is possible to reduce a phenomenon in which the voltage of the output terminal falls below the ground voltage, to thereby suppress the generation of an unnecessary leak current and to prevent the malfunction (interference) of the circuit.

(Modification of Second Embodiment)

Figure 11:
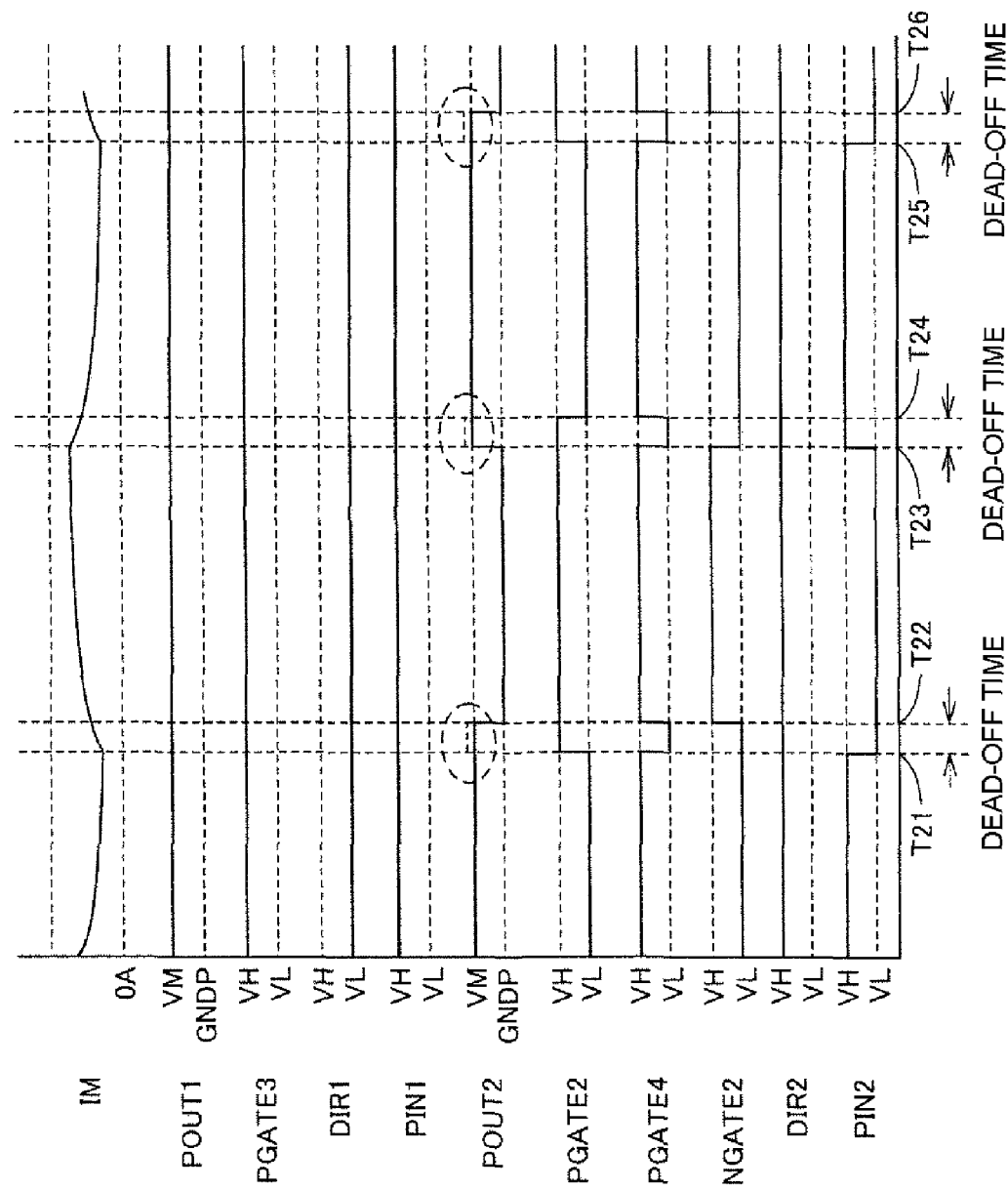
FIG. 11 is a timing chart explaining the operation state in accordance with the drive of the motor driver 12A according to a modification of the present Second Embodiment.

FIG. 11 is a timing chart explaining the operation state according to the drive of the motor driver 12A according to a modification of the present Second Embodiment.

With reference to FIG. 11, here, there are shown lowing to the load, and the voltage levels of the output terminals POUT1 and POUT2, of the control signals PIN1 and PIN2, of the gate terminals PGATE2, NGATE2, PGATE3 and PGATE4, and of the control signals DIR1 and DIR2.

Here, the control signal PIN1 is fixed at the "H" level. In accordance with the control signal PIN1 (at the "H" level), it is assumed that the transistor MP1 is fixed to a conductive (ON) state and the transistor MN1 is fixed to a non-conductive (OFF) state.

In addition, in accordance with the control signal PIN2, the gate terminals of the transistors MP2 and MN2 are controlled. Specifically, in accordance with the falling of the control signal PIN2 from the "H" level to the "L" level, the gate terminal of the transistor MP2 is set to the "H" level. In addition, after the lapse of the dead-off time period, the gate terminal of the transistor MN2 is set to the "H" level. Furthermore, in accordance with the rising of the control signal PIN2 from the "L" level to the "H" level, the gate terminal of the transistor MN2 is set to the "L" level. Moreover, after the lapse of the dead-off time period, the gate terminal of the transistor MP2 is set to the "L" level.

In the example, it is assumed that the control signal DIR1 is set to the "L" level and the control signal DIR2 is set to the "H" level.

At time T21, the control signal PIN2 makes a transition to the "L" level. Along with this, the gate terminal of the transistor MP2 (PGATE2) makes a transition to the "H" level. Then, the transistor MP2 is brought into a non-conductive (OFF) state. In addition, at time T22 after the lapse of the dead-off time period, the gate terminal of the transistor MN2 (NGATE2) makes a transition to the "H" level. Along with this, the gate terminal of the transistor MN2 (NGATE2) is brought into a conductive (ON) state.

Here, in the bridge circuit configured over the semiconductor device to which the coil L being the inductive load is coupled, there is described the case where the transition has occurred from a state in which a current is supplied to the coil L being the inductive load to a state of high impedance, that is, to the dead-off period provided for the purpose of what we call feedthrough-current prevention.

As the result of the transition of the transistor MN2 from a conductive (ON) state to anon-conductive (OFF) state, the transistor MN2 of the bridge circuit is brought into a cut-off state.

Along with this, the coil L being the inductive load tries to cause a current to flow from the output terminal POUT1 toward the output terminal POUT2. That is, an inductive load current is generated and flows in the forward direction from the P-type region to the N-type region via a parasitic diode of a PN-junction formed between the drain terminal and the back gate being the structure of the transistor MP2, and a current flows to a power source wiring via the coil L and the transistor MP2.

Consequently, in the output terminal POUT2 that is a terminal of a bridge circuit to which the coil L being the inductive load is coupled and that outputs a current, the voltage becomes a voltage higher than the power supply voltage VM by the forward voltage of the PN-junction (the dotted line region part in the present example). Also in this case, since the output terminal POUT2 is caused to have a voltage higher than the power supply voltage VM in the dead-off time period when the transistor is brought into a non-conductive (OFF) state, the parasitic transistor may become conductive and the leak current may flow in.

Therefore, in the present example, in the dead-off time period between the time T21 and the time T22, the second sub-drive part 21 sets the gate terminal of a bypass transistor MP4 (PGATE4) to the "L" level on the basis of the control signals PIN2 and DIR2. Along with this, the bypass transistor MP4 is brought into a conductive (ON) state. Accordingly, the output terminal POUT2 is joined electrically to the power supply voltage VM. Therefore, even when an inductive load current is generated, the voltage does not make a transition to a voltage higher than that of the output terminal POUT2 by the forward voltage of the diode.

In the same manner, at time T23, the control signal PIN2 makes a transition to the "H" level. Along with this, the gate terminal of the transistor MN2 (NGATE2) makes a transition from the "H" level to the "L" level. Then, the transistor MN2 is brought into a non-conductive (OFF) state. In addition, at time T24 after the lapse of the dead-off time period, the gate terminal of the transistor MP2 (PGATE2) makes a transition from the "H" level to the "L" level. Along with this, the transistor MP2 is brought into a conductive (ON) state.

In the dead-off time period between the time T23 and the time T24, the second sub-drive part 21 sets the gate terminal of the bypass transistor MP4 (PGATE4) to the "L" level on the basis of the control signals PIN2 and DIR2. Along with this, the bypass transistor MP4 is brought into a conductive (ON) state. Accordingly, the output terminal POUT2 is joined electrically to the power supply voltage VM. Therefore, even when an inductive load current is generated, the voltage does not make a transition to a voltage higher than that of the output terminal POUT2 by the forward voltage of the diode.

In addition, in the same manner, at time T25, the control signal PIN2 makes a transition to the "L" level. Along with this, the gate terminal of the transistor MP2 (PGATE2) makes a transition to the "H" level. Then, the transistor MP2 is brought into the non-conductive (OFF) state. In addition, at time T26 after the lapse of the dead-off time period, the gate terminal of the transistor MN2 (NGATE2) makes a transition to the "H" level. Along with this, the transistor MN2 is brought into the conductive (ON) state.

In the dead-off time period between the time T25 and the time T26, the second sub-drive part 21 sets the gate terminal of the bypass transistor MP4 (PGATE4) to the "L" level on the basis of the control signals PIN2 and DIR2. Along with this, the bypass transistor MP4 is brought into a conductive (ON) state. Accordingly, the output terminal POUT2 is joined electrically to the power supply voltage VM. Therefore, even when an inductive load current is generated, the voltage does not make a transition to a voltage higher than that of the output terminal POUT2 by the forward voltage of the diode.

Consequently, it becomes possible to prevent the generation of an unnecessary leak current that induces a malfunction of the circuit in the dead-off time period, because a reflux current (an inductive load current) flows via not the transistor MP2 but the transistor MP4. That is, in the period when the transistor MP2 is brought into a cut-off state, which is the generation factor of an unnecessary leak current, a current that generates the forward voltage of the PN-junction going through the back gate is supplied via the bypass transistor MP4. Consequently, by reducing the generation of a forward voltage, it is possible to reduce a phenomenon in which the voltage of the output terminal exceeds the power supply voltage, to thereby suppress the generation of an unnecessary leak current and to prevent the malfunction (interference) of the circuit.

(Third Embodiment)

Figure 12:
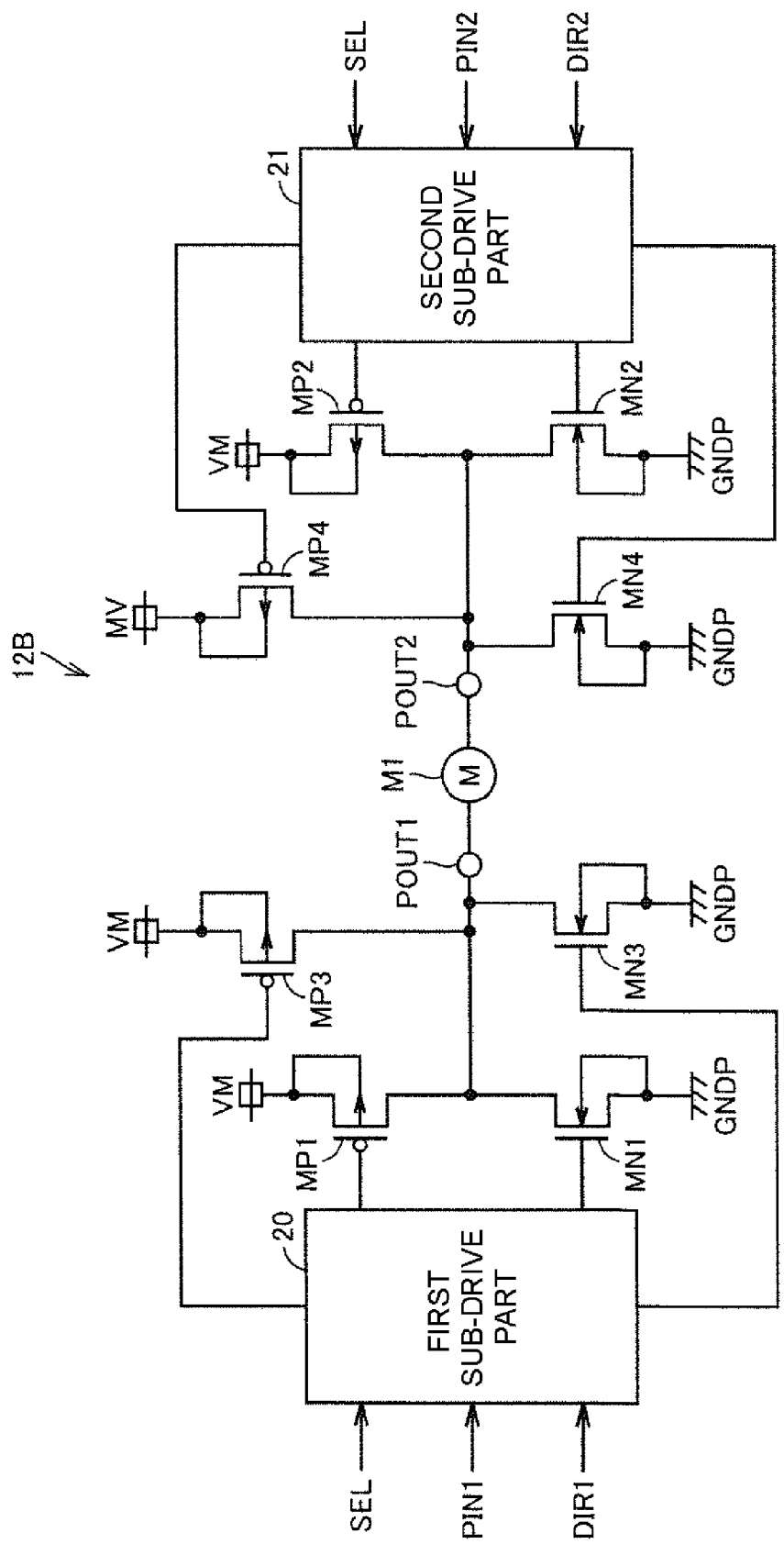
FIG. 12 is a diagram explaining the configuration of a motor driver 12B according to the present Third Embodiment.

FIG. 12 is a diagram explaining the configuration of a motor driver 12B according to the present Third Embodiment.

With reference to FIG. 12, the motor driver 12B is one combined with configurations of the motor drivers in FIG. 6 and FIG. 9.

That is, the motor driver 12B has the configuration including the bypass transistors MN3, MN4 and MP3, MP4.

Other points are the same, and thus the detailed explanation thereof is not repeated.

In addition, in each of the first sub-drive part 20 and the second sub-drive part 21, a switching signal SEL for switching the bypass transistors is inputted. As an example, it is assumed that, when the switching signal SEL is at the "H" level, the bypass transistors MN3 and MN4 are used. Furthermore, it is assumed that, when the switching signal SEL is at the "L" level, the bypass transistors MP3 and MP4 are used.

In the present Third Embodiment, the bypass transistors to be used are switched in accordance with circuit characteristics of the motor control unit.

Specifically, when comparing ground (GNDP) noise and power supply noise as circuit characteristics of the motor control unit, in the case where the unit is vulnerable to the power supply noise, the switching signal SEL is set to the "L" level in order to use the bypass transistors MP3 and MP4. In contrast, in the case where the unit is vulnerable to the ground noise, the switching signal SEL is set to the "H" level in order to use the bypass transistors MN3 and MN4.

Regarding the operation state associated with the drive of the general motor driver 12B, the same as explained above is applicable. That is, in the dead-off time period, the driver lowers the generation of the forward voltage using the bypass transistors MN3 and MN4, or MP3 and MP4.

In the present Third Embodiment, by using the appropriate bypass transistor applied to the side vulnerable to the noise, in accordance with the circuit characteristics of the motor control unit, it is possible to suppress the generation of an unnecessary leak current and to prevent the malfunction (interference) of the circuit.

Note that, in the above, the inductive load to be coupled to the output terminal has been mainly described, but the same is also applicable to the capacitive load.

With the configuration according to the above-mentioned embodiments, it becomes possible to realize, in a short period, highly functional, high-performance and low-cost products that mount a circuit driving an inductive load or a capacitive load on the identical chip, in particular, through the use of an inexpensive wafer process not including an isolation diffusion layer.

Hereinbefore, the invention achieved by the present inventor has been described specifically on the basis of the embodiments. However, it is needless to say that the invention is not limited to the embodiments, and various modifications are possible within the scope not departing from the gist of the invention.

What is claimed is:

1. A semiconductor device comprising:
   first and second output terminals coupled to one end side and another end side of an inductive or capacitive load, respectively;
   a first MOS transistor coupled between a first voltage and the first output terminal;
   a second MOS transistor coupled between a second voltage and the first output terminal;
   a third MOS transistor coupled between the first voltage and the second output terminal;
   a fourth MOS transistor coupled between the second voltage and the second output terminal; and
   a drive circuit driving the first to fourth MOS transistors for controlling the inductive or capacitive load, wherein
   the drive circuit drives the first to fourth MOS transistors while providing a dead-off period so that one of the first and second MOS transistors or one of the third and fourth MOS transistors is are brought into a non-conductive state, and
   the semiconductor device further comprises first and second bypass transistors which are provided corresponding to the first and second output terminals, respectively, the first bypass transistor is configured to provide bypassing of a forward current of a parasitic diode of a PN-junction formed in the one of the first and second MOS transistors brought into the non-conductive state in the dead-off period, and the second bypass transistor is configured to provide bypassing of a forward current of a parasitic diode of a PN-junction formed in the one of the third and fourth MOS transistors brought into the non-conductive state in the dead-off period, and
   the semiconductor device further comprises at least one inverter including a fifth MOS transistor and a sixth MOS transistor coupled between the first voltage and the second voltage, a parasitic transistor being formed to have a gate coupled to the second voltage, a collector coupled to a connection between the fifth MOS transistor and the sixth MOS transistor, and an emitter coupled to one of the first and second output terminals, and one of the corresponding first and second bypass transistor is configured to provide bypassing of a current from the parasitic transistor flowing toward the one of the first and second output terminals.

2. The semiconductor device according to claim 1,
   wherein the drive circuit includes:
   a first sub-drive circuit for driving the first and second MOS transistors in accordance with a first control signal; and
   a second sub-drive circuit for driving the third and fourth MOS transistors in accordance with a second control signal.

3. The semiconductor device according to claim 2,
   wherein the first sub-drive circuit drives the first bypass transistor according to the first control signal and a current direction signal that defines the direction of a current; and
   wherein the second sub-drive circuit drives the second bypass transistor according to the second control signal and a current direction signal that defines the direction of a current.

4. The semiconductor device according to claim 1,
   wherein the first and second bypass transistors are each coupled between the first and second output terminals and the second voltage; and
   wherein the device further comprises third and fourth bypass transistors which are coupled between the first and second output terminals, respectively, and the first voltage and which are configured for bypassing a forward current of a parasitic diode of a PN-junction formed in a respective MOS transistor brought in a non-conductive state in the dead-off period.

5. The semiconductor device according to claim 4,
   wherein the drive circuit receives a switching signal switching between the use of the first and second bypass transistors and the use of the third and fourth bypass transistors.

* * * * *